United States Patent
Kim

(10) Patent No.: US 9,871,094 B2
(45) Date of Patent: Jan. 16, 2018

(54) ORGANIC LIGHT EMITTING DIODE DISPLAY AND METHOD FOR MANUFACTURING ORGANIC LIGHT EMITTING DIODE DISPLAY

(71) Applicant: Samsung Display Co., Ltd., Yongin, Gyeonggi-do (KR)

(72) Inventor: Hyun Tae Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 64 days.

(21) Appl. No.: 14/729,388

(22) Filed: Jun. 3, 2015

(65) Prior Publication Data
US 2016/0104758 A1   Apr. 14, 2016

(30) Foreign Application Priority Data
Oct. 8, 2014 (KR) ........................ 10-2014-0136205

(51) Int. Cl.
*H04L 29/08* (2006.01)
*H01L 49/02* (2006.01)
*H01L 27/32* (2006.01)

(52) U.S. Cl.
CPC .......... *H01L 28/60* (2013.01); *H01L 27/3265* (2013.01); *H01L 27/3244* (2013.01)

(58) Field of Classification Search
CPC ...... H01L 27/3276; H01L 51/00; H01L 27/28
USPC ........................................... 438/23
See application file for complete search history.

(56) References Cited

U.S. PATENT DOCUMENTS

| | | | | |
|---|---|---|---|---|
| 2010/0270538 | A1* | 10/2010 | Kang | H01L 27/326 257/40 |
| 2012/0104397 | A1* | 5/2012 | Choi | H01L 27/1255 257/59 |
| 2013/0009154 | A1* | 1/2013 | Choi | H01L 27/124 257/59 |
| 2013/0292675 | A1* | 11/2013 | Tsubuku | H01L 29/66969 257/57 |

FOREIGN PATENT DOCUMENTS

| | | |
|---|---|---|
| KR | 10-2004-0025450 | 3/2004 |
| KR | 10-2006-0057769 | 5/2006 |
| KR | 10-0836472 | 6/2008 |
| KR | 10-1255834 | 4/2013 |

* cited by examiner

*Primary Examiner* — Tuan Nguyen
(74) *Attorney, Agent, or Firm* — Knobbe Martens Olson & Bear, LLP

(57) ABSTRACT

An organic light emitting device includes: a substrate; a first thin film transistor including a first active pattern positioned on the substrate and a first gate electrode positioned on the first active pattern; an organic light emitting element connected to the first active pattern; and a capacitor electrode overlapping the first gate electrode on the first gate electrode and having the same edge as the first gate electrode.

14 Claims, 10 Drawing Sheets

ORGANIC LIGHT EMITTING DIODE DISPLAY AND METHOD FOR MANUFACTURING ORGANIC LIGHT EMITTING DIODE DISPLAY

CROSS-REFERENCE TO RELATED APPLICATION

This application claims priority to, and the benefit of, Korean Patent Application No. 10-2014-0136205 filed in the Korean Intellectual Property Office on Oct. 8, 2014, the entire contents of which are incorporated herein by reference.

BACKGROUND

Field

The present disclosure relates to an organic light emitting device including a plurality of thin film transistors and capacitors, and a manufacturing method of the organic light emitting device.

Description of the Related Technology

In general, representative examples of a flat panel display include an organic light emitting display, a liquid crystal display, a plasma display panel, and the like.

Typically, the organic light emitting device includes a plurality of thin film transistors and capacitors, and a plurality of wires.

Such an organic light emitting device is generally manufactured by using a plurality of masks.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

One embodiment provides an organic light emitting device in which the number of masks used for a manufacturing the light emitting device is reduced, and a manufacturing method for the organic light emitting device.

Further, an organic light emitting device with a reduced manufacturing time and manufacturing cost and a manufacturing method thereof are provided.

An organic light emitting device according to one aspect includes: a substrate; a first thin film transistor including a first active pattern positioned on the substrate and a first gate electrode positioned on the first active pattern; an organic light emitting element connected to the first active pattern; and a capacitor electrode overlapping the first gate electrode and having the same edge as the first gate electrode.

The first gate electrode and the capacitor electrode may have the same edge in a plane view.

A capacitor may be formed by the first gate electrode and the capacitor electrode.

The first gate electrode and the capacitor electrode may each include a metal.

The capacitor electrode may have an island shape.

A channel region of the first active pattern overlapping the first gate electrode may have a shape that is bent and extends at least once.

A second thin film transistor including: a second active pattern connected to the first active pattern and a second gate electrode positioned on the second active pattern; a third thin film transistor including a third active pattern connecting between the first active pattern and the first gate electrode and a third gate electrode positioned on the third active pattern; a first scan line positioned on the second active pattern to respectively cross the second active pattern and the third active pattern and connected to the second gate electrode and the third gate electrode; a data line positioned on the first scan line to cross the first scan line and connected to the second active pattern; and a driving power source line positioned on the first scan line to be separated from the data line and to cross the first scan line and connected to the capacitor electrode and the first active pattern, may be further included.

A gate bridge positioned on the first scan line to be separated from the driving power source line and connecting the third active pattern and the first gate electrode may be further included.

The capacitor electrode may include an opening exposing a portion of the first gate electrode, and the gate bridge may be connected to the first gate electrode through the opening.

The first active pattern, the second active pattern, and the third active pattern may be respectively positioned with the same layer, and the data line, the driving power source line, and the gate bridge may be respectively positioned with the same layer.

A fourth thin film transistor including: a fourth active pattern connected to the first gate electrode and the third active pattern and a fourth gate electrode positioned on the fourth active pattern; a second scan line positioned on the fourth active pattern to cross the fourth active pattern and connected to the fourth gate electrode; and an initialization power source line positioned on the second scan line and connected to the fourth active pattern, may be further included.

The first gate electrode, the second gate electrode, the third gate electrode, the fourth gate electrode, the first scan line, and the second scan line may be respectively positioned with the same layer.

A seventh thin film transistor including: a seventh active pattern connected to the fourth active pattern and a seventh gate electrode positioned on the seventh active pattern; and a third scan line positioned on the seventh active pattern to cross the seventh active pattern and connected to the seventh gate electrode, may be further included.

A fifth thin film transistor including: a fifth active pattern connecting between the first active pattern and the driving power source line and a fifth gate electrode positioned on the fifth active pattern; a sixth thin film transistor including a sixth active pattern connecting between the first active pattern and the organic light emitting element and a sixth gate electrode positioned on the sixth active pattern; and an emission control line positioned on the fifth active pattern and the sixth active pattern to respectively cross the fifth active pattern and the sixth active pattern and respectively connected to the fifth gate electrode and the sixth gate electrode, may be further included.

The first gate electrode, the second gate electrode, the third gate electrode, the fifth gate electrode, the sixth gate electrode, and the emission control line may be respectively positioned with the same layer.

Another aspect includes: forming a first active pattern and a second active pattern connected to the first active pattern on a substrate; sequentially forming a first metal layer, an insulating layer, and a second metal layer on the first active pattern and the second active pattern; forming a first photoresist pattern having a first thickness on the second metal layer corresponding to the first active pattern and a second photoresist pattern having a second thickness thinner than the first thickness on the second metal layer corresponding to the second active pattern; etching the first metal layer, the insulating layer, and the second metal layer by using the first photoresist pattern and the second photoresist pattern as a mask; removing the second photoresist pattern and exposing the second metal layer positioned on the second active pattern; and removing the insulating layer and the second metal layer positioned on the second active pattern.

The first photoresist pattern and the second photoresist pattern may be formed by using a halftone mask.

The first metal layer, the insulating layer, and the second metal layer may be etched by using a dry etching.

The first metal layer, the insulating layer, and the second metal layer may be etched to form a first gate electrode from the first metal layer on the first active pattern and a capacitor electrode having the same edge as the first gate electrode from the second metal layer and to simultaneously form a second gate electrode from the first metal layer on the second active pattern.

The insulating layer and the second metal layer positioned on the second gate electrode may be removed to remove the second metal layer.

According to embodiments of the present invention, the organic light emitting device with the reduced number of masks used for the manufacturing of the organic light emitting device and the manufacturing method of the organic light emitting device are provided.

Further, the organic light emitting device with the reduced manufacturing time and manufacturing cost and the manufacturing method of the organic light emitting device are provided.

DETAILED DESCRIPTION OF CERTAIN INVENTIVE EMBODIMENTS

Figure 1:
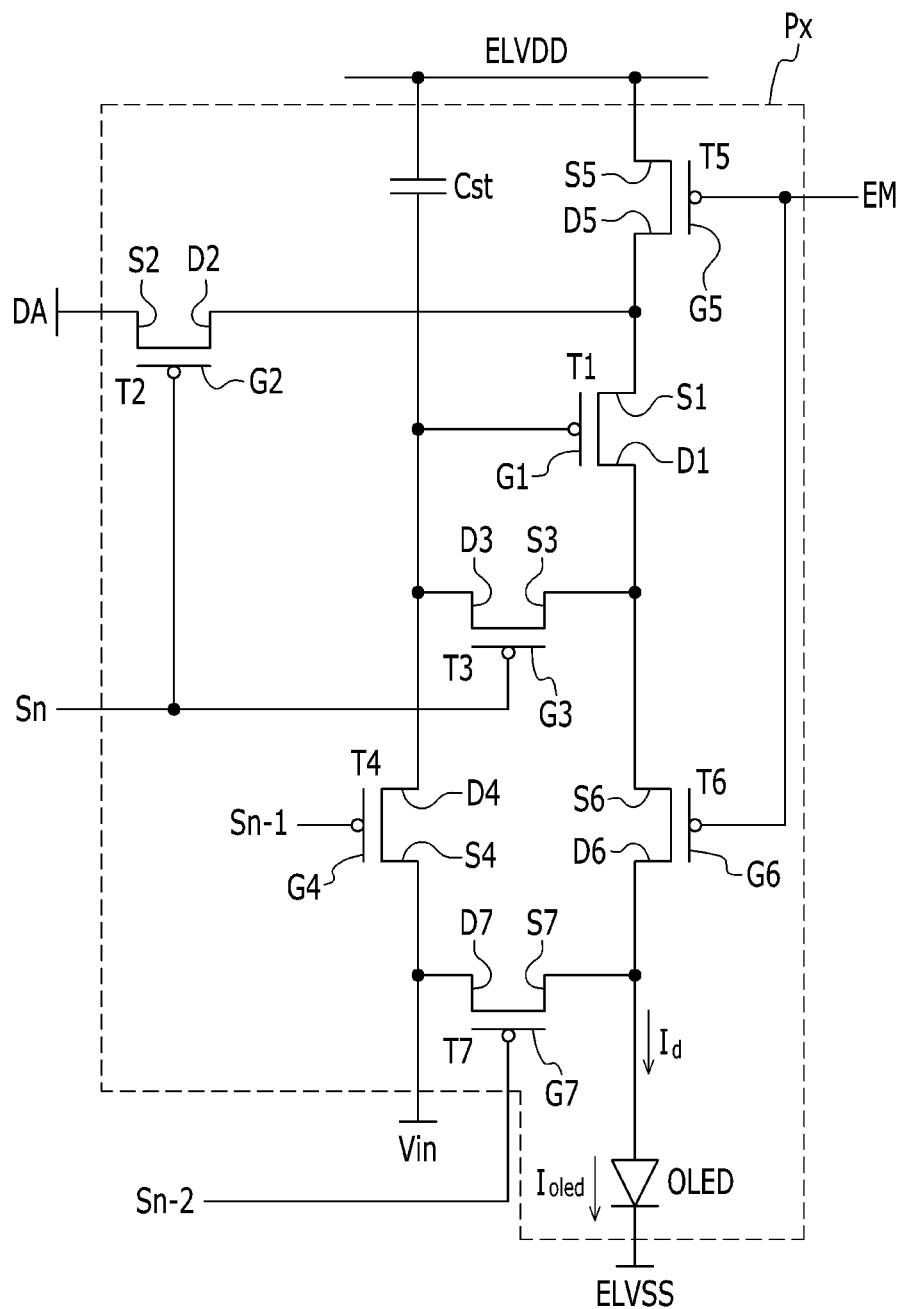
FIG. 1 is a circuit diagram of a pixel of an organic light emitting device according to an embodiment.

The present disclosure will be described more fully hereinafter with reference to the accompanying drawings, in which certain embodiments of the invention are shown. As those skilled in the art would realize, the described embodiments may be modified in various ways, without departing from the spirit or scope of the present invention.

Parts unrelated to the description of the embodiments are not shown to make the description clear, and like reference numerals generally designate like elements throughout the specification.

Further, in the described embodiments, since like reference numerals generally designate like elements having the same configuration, a first embodiment is representatively described, and in other embodiments, only configurations different from the first embodiment is described.

In addition, the size and thickness of each element shown in the drawings are arbitrarily shown for better understanding and ease of description, but the present invention is not limited thereto.

In the drawings, the thickness of layers, films, panels, regions, and the like may be exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, in the specification, the word "on" means positioning above or below the object portion, but does not essentially mean positioning on the upper side of the object portion based on a gravity direction.

An organic light emitting device according to an embodiment is described with reference to FIG. 1 to FIG. 3.

A circuit diagram of a pixel of an organic light emitting device according to an embodiment is described with reference to FIG. 1. Here, a pixel means a minimum unit displaying an image.

FIG. 1 is a circuit diagram of a pixel of an organic light emitting device according to an embodiment.

As shown in FIG. 1, one pixel Px of an organic light emitting device according to an embodiment includes a plurality of thin film transistors T1, T2, T3, T4, T5, T6, and T7, a plurality of wires Sn, Sn-1, Sn-2, EM, Vin, DA, and ELVDD selectively connected to the plurality of thin film transistors T1, T2, T3, T4, T5, T6, and T7, a capacitor Cst, and an organic light emitting element OLED.

The plurality of thin film transistors T1, T2, T3, T4, T5, T6, and T7 include a first thin film transistor T1, a second thin film transistor T2, a third thin film transistor T3, a fourth thin film transistor T4, a fifth thin film transistor T5, a sixth thin film transistor T6, and a seventh thin film transistor T7.

A first gate electrode G1 of the first thin film transistor T1 is respectively connected to a third drain electrode D3 of the third thin film transistor T3 and a fourth drain electrode D4 of the fourth thin film transistor T4. A first source electrode S1 is respectively connected to a second drain electrode D2 of the second thin film transistor T2 and a fifth drain electrode D5 of the fifth thin film transistor T5. A first drain electrode D1 is respectively connected to a third source electrode S3 of the third thin film transistor T3 and a sixth source electrode S6 of the sixth thin film transistor T6.

A second gate electrode G2 of the second thin film transistor T2 is connected to the first scan line Sn. A second source electrode S2 is connected to the data line DA. A second drain electrode D2 is connected to a first source electrode S1 of the first thin film transistor T1.

A third gate electrode G3 of the third thin film transistor T3 is connected to the first scan line Sn. Aa third source electrode S3 is connected to the first drain electrode D1 of the first thin film transistor T1. A third drain electrode D3 is connected to the first gate electrode G1 of the first thin film transistor T1.

A fourth gate electrode G4 of the fourth thin film transistor T4 is connected to the second scan line Sn-1. A fourth source electrode S4 is connected to the initialization power source line Vin. A fourth drain electrode D4 is connected to the first gate electrode G1 of the first thin film transistor T1.

A fifth gate electrode G5 of the fifth thin film transistor T5 is connected to the emission control line EM. A fifth source electrode S5 is connected to the driving power source line ELVDD. A fifth drain electrode D5 is connected to the first source electrode S1 of the first thin film transistor T1.

A sixth gate electrode G6 of the sixth thin film transistor T6 is connected to the emission control line EM. A sixth source electrode S6 is connected to the first drain electrode D1 of the first thin film transistor T1. A sixth drain electrode D6 is connected to the organic light emitting element OLED.

A seventh gate electrode G7 of the seventh thin film transistor T7 is connected to the third scan line Sn-2. A seventh source electrode S7 is connected to the organic light emitting element OLED. A seventh drain electrode D7 is connected to the fourth source electrode S4 of the fourth thin film transistor T4.

The plurality of wires includes a first scan line Sn transmitting a first scan signal to the second gate electrode G2 and the third gate electrode G3, a second scan line Sn-1 transmitting a second scan signal to the fourth gate electrode G4, a third scan line Sn-2 transmitting a third scan signal to the seventh gate electrode G7, an emission control line EM transmitting an emission control signal to the fifth gate electrode G5 and the sixth gate electrode G6, a data line DA transmitting a data signal to the second source electrode S2, a driving power source line ELVDD transmitting a driving signal to one electrode of the capacitor Cst and to the fifth source electrode S5, and an initialization power source line Vin supplying an initialization signal to the fourth source electrode S4.

The capacitor Cst includes one electrode connected to the driving power source line ELVDD and the other electrode connected to the first gate electrode G1 and the third drain electrode D3.

The organic light emitting element OLED includes a first electrode, a second electrode positioned on the first electrode, and an organic emission layer positioned between the first electrode and the second electrode. The first electrode of the organic light emitting element OLED is connected to the seventh source electrode S7 and the sixth drain electrode D6, and the second electrode is connected to a common power source ELVSS transmitting a common signal.

As a driving example of the pixel circuit, first, if the third scan line Sn-2 is transmitted with the third scan signal such that the seventh thin film transistor T7 is turned on, the remaining current flowing to the first electrode of the organic light emitting element OLED is output to the fourth thin film transistor T4 through the seventh thin film transistor T7 such that the desired emission of the organic light emitting element OLED by the remaining current flowing to the first electrode of the organic light emitting element OLED is suppressed.

Next, if the second scan line Sn-1 is transmitted with the second scan signal such that the initialization power source line Vin is transmitted with the initialization signal, the fourth thin film transistor T4 is turned on such that the initialization voltage by the initialization signal is supplied to the first gate electrode G1 and the other electrode capacitor Cst through the fourth thin film transistor T4, and thereby the first gate electrode G1 and the capacitor Cst are initialized. In this case, while the first gate electrode G1 is initialized, the first thin film transistor T1 is turned on.

Next, if the first scan line Sn is transmitted with the first scan signal and the data line DA is transmitted with the data signal, the second thin film transistor T2 and the third thin film transistor T3 are respectively turned on such that the data voltage Vd by the data signal is transmitted to the first gate electrode G1 through the second thin film transistor T2, the first thin film transistor T1, and the third thin film transistor T3. In this case, the first gate electrode G1 is supplied with a compensation voltage {Vd+Vth, where Vth is a negative (−) value} of which the data voltage Vd supplied from the initial data line DA is reduced by the threshold voltage (Vth) of the first thin film transistor T1. The compensation voltage Vd+Vth supplied to the first gate electrode G1 is also supplied to the other electrode of the capacitor Cst connected to the first gate electrode G1.

Next, one electrode of the capacitor Cst is supplied with the driving voltage Vel by the driving signal from the driving power source line ELVDD and the other electrode is supplied with the above-described compensation voltage Vd+Vth, and thereby the capacitor Cst stores the charge corresponding to the difference of the voltages that are respectively applied to both electrodes such that the first thin film transistor T1 is turned on during a predetermined time.

Next, if the emission control line EM is applied with the emission control signal, the fifth thin film transistor T5 and the sixth thin film transistor T6 are respectively turned on such that the driving voltage Vel by the driving signal from the driving power source line ELVDD is supplied to the first thin film transistor T1 through the fifth thin film transistor T5.

Thus, while the driving voltage Vel is turned on by the capacitor Cst and passes the first thin film transistor T1, a driving current Id, corresponding to the difference between the voltage supplied to the first gate electrode G1 by the capacitor Cst and the driving voltage Vel, flows to the first drain electrode D1 of the first thin film transistor T1, and the driving current Id is supplied to the organic light emitting element OLED through the sixth thin film transistor T6, and thereby the organic light emitting element OLED is emitted during a predetermined time.

The pixel circuit of the organic light emitting device according to an embodiment includes the first thin film transistor T1 to the seventh thin film transistor T7, the capacitor Cst, the first scan line Sn to the third scan line Sn-2, the data line DA, the driving power source line ELVDD, and the initialization power source line Vin, however it is not limited thereto, and the pixel circuit of the organic light emitting device according to another embodiment may include more or less thin film transistors, at least one capacitor, and wires including at least one scan line and at least one driving power source line.

Next, an arrangement of the pixel of the described organic light emitting device according to an embodiment is described with reference to FIG. 2 and FIG. 3. Insulating layers may be positioned between elements positioned at the described different layers, and the insulating layers may include an inorganic insulating layer such as, for example, a silicon nitride or a silicon oxide, or an organic insulating layer. Also, these insulating layers may be formed of a single layer or a plurality of layers.

Figure 2:
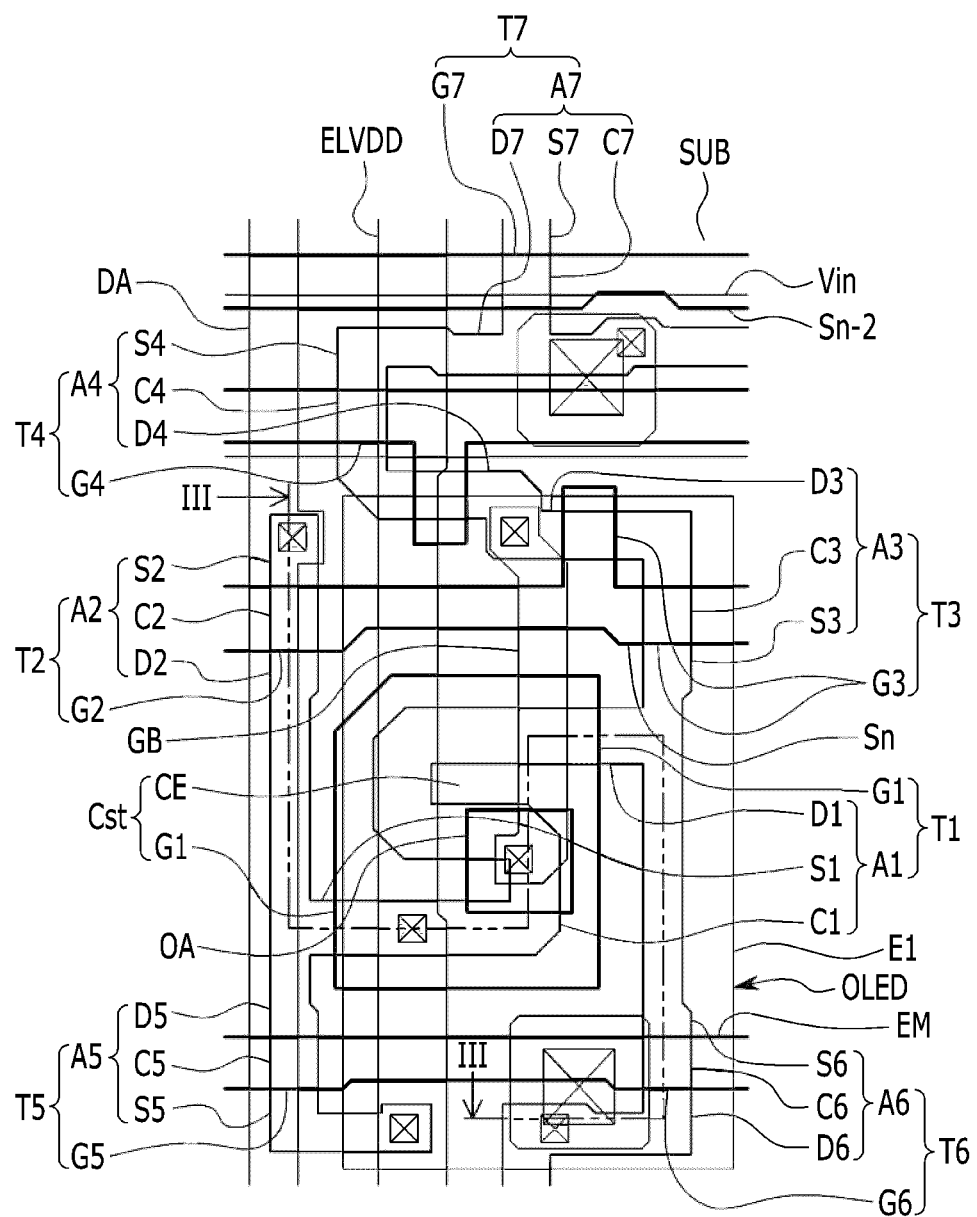
FIG. 2 is a layout view of a pixel of an organic light emitting device according to an embodiment.

FIG. 2 is a layout view of a pixel of an organic light emitting device according to an embodiment. FIG. 3 is a cross-sectional view taken along a line III-III of FIG. 2.

Figure 3:
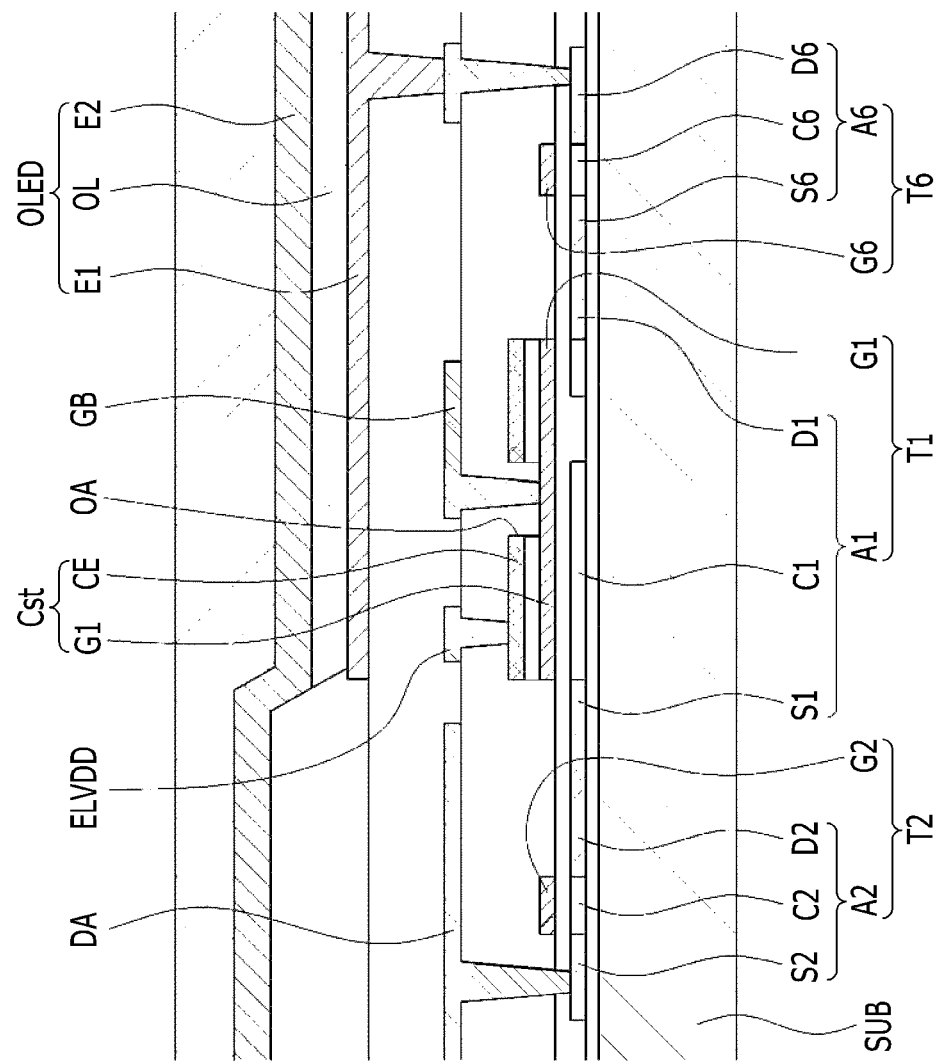
FIG. 3 is a cross-sectional view taken along a line III-III of FIG. 2.

As shown in FIG. 2 and FIG. 3, the organic light emitting device according to an embodiment includes a substrate SUB, a first thin film transistor T1, a second thin film transistor T2, a third thin film transistor T3, a fourth thin film transistor T4, a fifth thin film transistor T5, a sixth thin film transistor T6, a seventh thin film transistor T7, a first scan line Sn, a second scan line Sn-1, a third scan line Sn-2, an emission control line EM, a capacitor Cst, a data line DA, a driving power source line ELVDD, a gate bridge GB, an initialization power source line Vin, and an organic light emitting element OLED.

The substrate SUB may include glass, quartz, ceramic, sapphire, plastic, metal, and the like, and may be flexible, stretchable, rollable, or foldable. Since the substrate SUB may be flexible, stretchable, rollable, or foldable, the entire organic light emitting device may similarly be flexible, stretchable, rollable, or foldable.

The first thin film transistor T1 is positioned on the substrate SUB and includes a first active pattern A1 and the first gate electrode G1.

The first active pattern A1 includes the first source electrode S1, a first channel C1, and the first drain electrode D1. The first source electrode S1 is respectively connected to the second drain electrode D2 and the fifth drain electrode D5, and the first drain electrode D1 is respectively connected to the third source electrode S3 and the sixth source electrode S6. The first channel C1 as a channel region of the first active pattern A1 overlapping the first gate electrode G1 and has a shape that is bent and extended at least once, by bending and extending the first channel C1 in a space overlapping the first gate electrode G1 as a limited space at least once, since a length of the first channel C1 may be elongated, a driving range of the gate voltage applied to the first gate electrode G1 may be widened. Accordingly, the gray of the light emitted from the organic light emitting element OLED may be further minutely controlled by changing the magnitude of the gate voltage applied to the first gate electrode G1 within the wide driving range, thereby improving the quality of the image displayed by the organic light emitting device. The shape of such a first active pattern A1$a$ is variously modified, and thus various shapes such as "reverse S", "S", "M", "W", and the like are possible The first active pattern A1 may include polysilicon or an oxide semiconductor. The oxide semiconductor may include one of oxides based on titanium (Ti), hafnium (Hf), zirconium (Zr, aluminum (Al), tantalum (Ta), germanium (Ge), zinc (Zn), gallium (Ga), tin (Sn), or indium (In), such as zinc oxide (ZnO), indium-gallium-zinc oxide (InGaZnO4), indium zinc oxide (Zn—In—O), zinc-tin oxide (Zn—Sn—O), indium gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium gallium oxide (In—Ge—Ga—O), titanium-indium-zinc oxide (Ti—In—Zn—O), and hafnium-indium-zinc oxide (Hf—In—Zn—O) which are complex oxides thereof. In the case when the first active pattern A1 includes the oxide semiconductor, in order to protect the oxide semiconductor that is vulnerable to an external environment such as a high temperature, a separate passivation layer may be added.

The first channel C1 of the first active pattern A1 may be doped with an N-type impurity or a P-type impurity, and the first source electrode S1 and the first drain electrode D1 may be respectively separated via the first channel C1 and may be doped with an impurity which is opposite to the impurity doped in the first channel C1.

The first gate electrode G1 is positioned on the first channel C1 of the first active pattern A1 and has an island shape. The first gate electrode G1 is connected to the fourth drain electrode D4 and the third drain electrode D3 by a gate bridge GB passing through a contact hole. The first gate electrode G1 overlaps the capacitor electrode CE and has a function as the gate electrode of the first thin film transistor T1 and the other electrode of the capacitor Cst simultaneously. That is, the first gate electrode G1 forms the capacitor Cst along with the capacitor electrode CE. The first gate electrode G1 may be simultaneously formed with the capacitor electrode CE by the process forming the capacitor electrode CE, and accordingly the first gate electrode G1 and the capacitor electrode CE may have the same edge in a plane view. The first gate electrode G1 may include a metal.

The second thin film transistor T2 is positioned on the substrate SUB, and includes a second active pattern A2 and the second gate electrode G2.

The second active pattern A2 includes the second source electrode S2, a second channel C2, and the second drain electrode D2. The second source electrode S2 is connected to the data line DA through the contact hole, and the second drain electrode D2 is connected to the first source electrode S1. The second channel C2 as the channel region of the second active pattern A2 overlapping the second gate electrode G2 is positioned between the second source electrode S2 and the second drain electrode D2. That is, the second active pattern A2 is connected to the first active pattern A1.

The second channel C2 of the second active pattern A2 may be doped with the N-type impurity or the P-type impurity, and the second source electrode S2 and the second drain electrode D2 are separated via the first channel C1 interposed therebetween and may be doped with the doping impurity of the opposite type to the doping impurity doped to the first channel C1. The second active pattern A2 is positioned with the same layer as the first active pattern A1, includes the same material as the first active pattern A1, and is integrally formed with the first active pattern A1.

The second gate electrode G2 is positioned on the second channel C2 of the second active pattern A2 and is integrally formed with the first scan line Sn.

The third thin film transistor T3 is positioned on the substrate SUB, and includes a third active pattern A3 and the third gate electrode G3.

The third active pattern A3 includes the third source electrode S3, a third channel C3, and the third drain electrode D3. The third source electrode S3 is connected to the first drain electrode D1, and the third drain electrode D3 is connected to the first gate electrode G1 by the gate bridge GB through the contact hole. The third channel C3 as the channel region of the third active pattern A3 overlapping the third gate electrode G3 is positioned between the third source electrode S3 and the third drain electrode D3. That is, the third active pattern A3 connects between the first active pattern A1 and the first gate electrode G1.

The third channel C3 of the third active pattern A3 may be doped with the N-type impurity or the P-type impurity, and the third source electrode S3 and the third drain electrode D3 are separated via the third channel C3 and may be doped with the doping impurity of the opposite type to the doping impurity doped to the third channel C3. The third active pattern A3 is positioned with the same layer as the first active pattern A1 and the second active pattern A2, is formed with the same material as the first active pattern A1 and the second active pattern A2, and is integrally formed with the first active pattern A1 and the second active pattern A2.

The third gate electrode G3 is positioned on the third channel C3 of the third active pattern A3 and is integrally formed with the first scan line Sn. The third gate electrode G3 is formed of a dual gate electrode.

The fourth thin film transistor T4 is positioned on the substrate SUB, and includes the fourth active pattern A4 and the fourth gate electrode G4.

The fourth active pattern A4 includes the fourth source electrode S4, a fourth channel C4, and the fourth drain electrode D4. The fourth source electrode S4 is connected to the initialization power source line Vin through the contact hole, and the fourth drain electrode D4 is connected to the first gate electrode G1 by the gate bridge GB passing through the contact hole. The fourth channel C4 as the channel region of the fourth active pattern A4 overlapping the fourth gate electrode G4 is positioned between the fourth source electrode S4 and the fourth drain electrode D4. That is, the fourth active pattern A4 connects between the initialization power source line Vin and the first gate electrode G1 and is simultaneously connected to the third active pattern A3 and the first gate electrode G1, respectively.

The fourth channel C4 of the fourth active pattern A4 may be doped with the N-type impurity or the P-type impurity, and the fourth source electrode S4 and the fourth drain electrode D4 are separated via the fourth channel C4 interposed therebetween and may be doped with the doping impurity of the opposite type to the doping impurity doped to the fourth channel C4. The fourth active pattern A4 is positioned with the same layer as the first active pattern A1, the second active pattern A2, and the third active pattern A3, includes the same material as the first active pattern A1, the second active pattern A2, and the third active pattern A3, and is integrally formed with the first active pattern A1, the second active pattern A2, and the third active pattern A3.

The fourth gate electrode G4 is positioned on the fourth channel C4 of the fourth active pattern A4 and is integrally formed with the second scan line Sn-1. The fourth gate electrode G4 is formed as the dual gate electrode.

The fifth thin film transistor T5 is positioned on the substrate SUB and includes the fifth active pattern A5 and the fifth gate electrode G5.

The fifth active pattern A5 includes the fifth source electrode S5, a fifth channel C5, and the fifth drain electrode D5. The fifth source electrode S5 is connected to the driving power source line ELVDD through the contact hole, and the fifth drain electrode D5 is connected to the first source electrode S1. The fifth channel C5 as the channel region of the fifth active pattern A5 overlapping the fifth gate electrode G5 is positioned between the fifth source electrode S5 and the fifth drain electrode D5. That is, the fifth active pattern A5 connects between the driving power source line ELVDD and the first active pattern A1.

The fifth channel C5 of the fifth active pattern A5 may be doped with the N-type impurity or the P-type impurity, and the fifth source electrode S5 and the fifth drain electrode D5 are separated via the fifth channel C5 interposed therebetween and may be doped with the doping impurity of the opposite type to the doping impurity doped to the fifth channel C5. The fifth active pattern A5 is positioned with the same layer as the first active pattern A1, the second active pattern A2, the third active pattern A3, and the fourth active pattern A4, includes the same material as the first active pattern A1, the second active pattern A2, the third active pattern A3, and the fourth active pattern A4, and is integrally formed with the first active pattern A1, the second active pattern A2, the third active pattern A3, and the fourth active pattern A4.

The fifth gate electrode G5 is positioned on the fifth channel C5 of the fifth active pattern A5 and is integrally formed with the emission control line EM.

The sixth thin film transistor T6 is positioned on the substrate SUB and includes the sixth active pattern A6 and the sixth gate electrode G6.

The sixth active pattern A6 includes the sixth source electrode S6, the sixth channel C6, and the sixth drain electrode D6. The sixth source electrode S6 is connected to the first drain electrode D1, and the sixth drain electrode D6 is connected to the first electrode E1 of the organic light emitting element OLED. The sixth channel C6 as the channel region of the sixth active pattern A6 overlapping the sixth gate electrode G6 is positioned between the sixth source electrode S6 and the sixth drain electrode D6. That is, the sixth active pattern A6 connects between the first active pattern A1 and the first electrode E1 of the organic light emitting element OLED.

The sixth channel C6 of the sixth active pattern A6 may be doped with the N-type impurity or the P-type impurity, and the sixth source electrode S6 and the sixth drain electrode D6 are separated via the sixth channel C6 interposed therebetween and may be doped with the doping impurity of the opposite type to the doping impurity doped to the sixth channel C6. The sixth active pattern A6 is positioned with the same layer as the first active pattern A1, the second active pattern A2, the third active pattern A3, the fourth active pattern A4, and the fifth active pattern A5, includes the same material as the first active pattern A1, the second active pattern A2, the third active pattern A3, the fourth active pattern A4, and the fifth active pattern A5, and is integrally formed with the first active pattern A1, the second active pattern A2, the third active pattern A3, the fourth active pattern A4, and the fifth active pattern A5.

The sixth gate electrode G6 is positioned on the sixth channel C6 of the sixth active pattern A6 and is integrally formed with the emission control line EM.

The seventh thin film transistor T7 is positioned on the substrate SUB, and includes a seventh active pattern A7 and the seventh gate electrode G7.

The seventh active pattern A7 includes the seventh source electrode S7, a seventh channel C7, and the seventh drain electrode D7. The seventh source electrode S7 is connected to the first electrode of the organic light emitting element of the other pixel that is not shown in FIG. 2 (a pixel positioned on the pixel shown in FIG. 2), and the seventh drain electrode D7 is connected to the fourth source electrode S4. The seventh channel C7 as the channel region of the seventh active pattern A7 overlapping the seventh gate electrode G7 is positioned between the seventh source electrode S7 and the seventh drain electrode D7. That is, the seventh active pattern A7 connects the first electrode of the organic light emitting element and the fourth active pattern A4.

The seventh channel C7 of the seventh active pattern A7 may be doped with the N-type impurity or the P-type impurity, and the seventh source electrode S7 and the seventh drain electrode D7 are separated via the seventh channel C7 interposed therebetween and may be doped with the doping impurity of the opposite type to the doping impurity doped to the seventh channel C7. The seventh active pattern A7 is positioned with the same layer as the first active pattern A1, the second active pattern A2, the third active pattern A3, the fourth active pattern A4, the fifth active pattern A5, and the sixth active pattern A6, includes the same material as the first active pattern A1, the second active pattern A2, the third active pattern A3, the fourth active pattern A4, the fifth active pattern A5, and the sixth active pattern A6, and is integrally formed with the first active pattern A1, the second active pattern A2, the third active pattern A3, the fourth active pattern A4, the fifth active pattern A5, and the sixth active pattern A6.

The seventh gate electrode G7 is positioned on the seventh channel C7 of the seventh active pattern A7 and is integrally formed with the third scan line Sn-2.

The first scan line Sn is positioned on the second active pattern A2 and the third active pattern A3 to extend in a direction crossing the second active pattern A2 and the third active pattern A3, and is integrally formed with the second gate electrode G2 and the third gate electrode G3 to be connected to the second gate electrode G2 and the third gate electrode G3.

The second scan line Sn-1 separated from the first scan line Sn is positioned on the fourth active pattern A4, extends in the direction crossing the fourth active pattern A4, and is integrally formed with the fourth gate electrode G4 to be connected to the fourth gate electrode G4.

The third scan line Sn-2 separated from the second scan line Sn-1 is positioned on the seventh active pattern A7, extends in the direction crossing the seventh active pattern A7, and is integrally formed with the seventh gate electrode G7 to be connected to the seventh gate electrode G7.

The emission control line EM separated from the first scan line Sn is positioned on the fifth active pattern A5 and the sixth active pattern A6, extends in the direction crossing the fifth active pattern A5 and the sixth active pattern A6, and is integrally formed with the fifth gate electrode G5 and the sixth gate electrode G6 to be connected to the fifth gate electrode G5 and the sixth gate electrode G6.

As described above, the emission control line EM, the third scan line Sn-2, the second scan line Sn-1, the first scan line Sn, the first gate electrode G1, the second gate electrode G2, the third gate electrode G3, the fourth gate electrode G4, the fifth gate electrode G5, the sixth gate electrode G6, and the seventh gate electrode G7 are positioned with the same layer and include the same material. In another embodiment, the emission control line EM, the third scan line Sn-2, the second scan line Sn-1, the first scan line Sn, the first gate electrode G1, the second gate electrode G2, the third gate electrode G3, the fourth gate electrode G4, the fifth gate electrode G5, the sixth gate electrode G6, and the seventh gate electrode G7 may be respectively and selectively positioned with different layers and may include different materials.

The capacitor Cst includes two electrodes facing each other via the insulating layer interposed therebetween. One electrode may be the capacitor electrode CE and the other electrode may be the first gate electrode G1. The capacitor electrode CE is positioned on the first gate electrode G1 and is connected to the driving power source line ELVDD through the contact hole. The capacitor electrode CE overlaps the first gate electrode G1 on the first gate electrode G1 and has the same edge as the first gate electrode G1 in a plane view.

The capacitor electrode CE forms the capacitor Cst along with the first gate electrode G1, and the first gate electrode G1 and the capacitor electrode CE may include the same or different metals in the different layers. The capacitor electrode CE has an island shape. The capacitor electrode CE may be simultaneously formed with the first gate electrode G1 in the etching process forming the first gate electrode G1, thereby the capacitor electrode CE may have the same edge as the first gate electrode G1 in a plane view. The capacitor electrode CE may be simultaneously formed with the first gate electrode G1, the emission control line EM, the third scan line Sn-2, the second scan line Sn-1, the first scan line Sn, the second gate electrode G2, the third gate electrode G3, the fourth gate electrode G4, the fifth gate electrode G5, the sixth gate electrode G6, and the seventh gate electrode G7 by the etching process forming the first gate electrode G1, the emission control line EM, the third scan line Sn-2, the second scan line Sn-1, the first scan line Sn, the second gate electrode G2, the third gate electrode G3, the fourth gate electrode G4, the fifth gate electrode G5, the sixth gate electrode G6, and the seventh gate electrode G7.

The capacitor electrode CE includes an opening OA exposing a portion of the first gate electrode G1, and the gate bridge GB is connected to the first gate electrode G1 through the opening OA.

The data line DA is positioned on the first scan line Sn to extend in the other direction crossing the first scan line Sn and is connected to the second source electrode S2 of the second active pattern A2 through the contact hole. The data line DA extends across the first scan line Sn, the second scan line Sn-1, the third scan line Sn-2, and the emission control line EM.

The driving power source line ELVDD separated from the data line DA is positioned on the first scan line Sn, extends in the other direction crossing the first scan line Sn, and is connected to the fifth source electrode S5 of the fifth active pattern A5 connected to the capacitor electrode CE and the first active pattern A1 through the contact hole. The driving power source line ELVDD extends across the first scan line Sn, the second scan line Sn-1, the third scan line Sn-2, and the emission control line EM.

The gate bridge GB positioned on the first scan line Sn is separated from the driving power source line ELVDD, is respectively connected to the third drain electrode D3 of the third active pattern A3 and the fourth drain electrode D4 of the fourth active pattern A4 through the contact hole, and is connected to the first gate electrode G1 exposed by the opening OA of the capacitor electrode CE.

As described above, the data line DA, the driving power source line ELVDD, and the gate bridge GB are positioned with the same layer and include the same material. In another embodiment, the data line DA, the driving power source line ELVDD, and the gate bridge GB may be respectively and selectively positioned and formed with different layers and different materials.

The initialization power source line Vin is positioned on the second scan line Sn-1 and is connected to the fourth source electrode S4 of the fourth active pattern A4 through the contact hole. The initialization power source line Vin is positioned with the same layer and includes the same material as the first electrode E1 of the organic light emitting element OLED. In another embodiment, the initialization power source line Vin may be positioned with the different layer and formed of a different material from the first electrode E1.

The organic light emitting element OLED includes the first electrode E1, the organic emission layer OL, and the second electrode E2. The first electrode E1 is connected to the sixth drain electrode D6 through the contract hole. The organic emission layer OL is positioned between the first electrode E1 and the second electrode E2. The second electrode E2 is positioned on the organic emission layer OL. At least one electrode of the first electrode E1 and the second electrode E2 may be a light transmission electrode, a light reflection electrode, or a light translucent electrode, and the light emitted from the organic emission layer OL may be emitted in at least one electrode direction of the first electrode E1 and the second electrode E2.

A capping layer covering the organic light emitting element OLED may be positioned on the organic light emitting element OLED, and a thin film encapsulation layer or an encapsulation substrate may be positioned on the organic light emitting element OLED via the capping layer.

In the described organic light emitting device, the capacitor electrode CE forming the capacitor Cst is simultaneously formed with the first gate electrode G1 by the etching process forming the first gate electrode G1 such that the capacitor electrode CE has the same edge as the first gate electrode G1 in a plane view, thereby reducing the number of masks used for the manufacturing. By reducing the number of masks used for the manufacturing, the organic light emitting device with the reduced manufacturing time and manufacturing cost is provided.

In the organic light emitting device, the capacitor electrode CE and the first gate electrode G1 forming the capacitor Cst are respectively formed of the metal such that surface illumination of the metal may be small compared with polysilicon, thereby increasing the storage capacitance of the capacitor Cst in the limited area. Accordingly, the organic light emitting device with an improved display quality is provided.

Also, in the organic light emitting device, since the capacitor electrode CE and the first gate electrode G1 forming the capacitor Cst have the same edge in a plane view, an error of the storage capacitance stored to the capacitor Cst is suppressed compared with the storage capacitance that is originally designed.

Further, in the organic light emitting device, since the capacitor electrode CE and the first gate electrode G1 forming the capacitor Cst have the same edge in a plane view, the undesired storage capacitance formed in a region outside the region forming the capacitor Cst is suppressed.

Next, a manufacturing method of the organic light emitting device according to another embodiment is described with reference to FIG. 4 to FIG. 10. The above-described embodiment of an organic light emitting device may be manufactured by using an embodiment of the manufacturing method.

Figure 4:
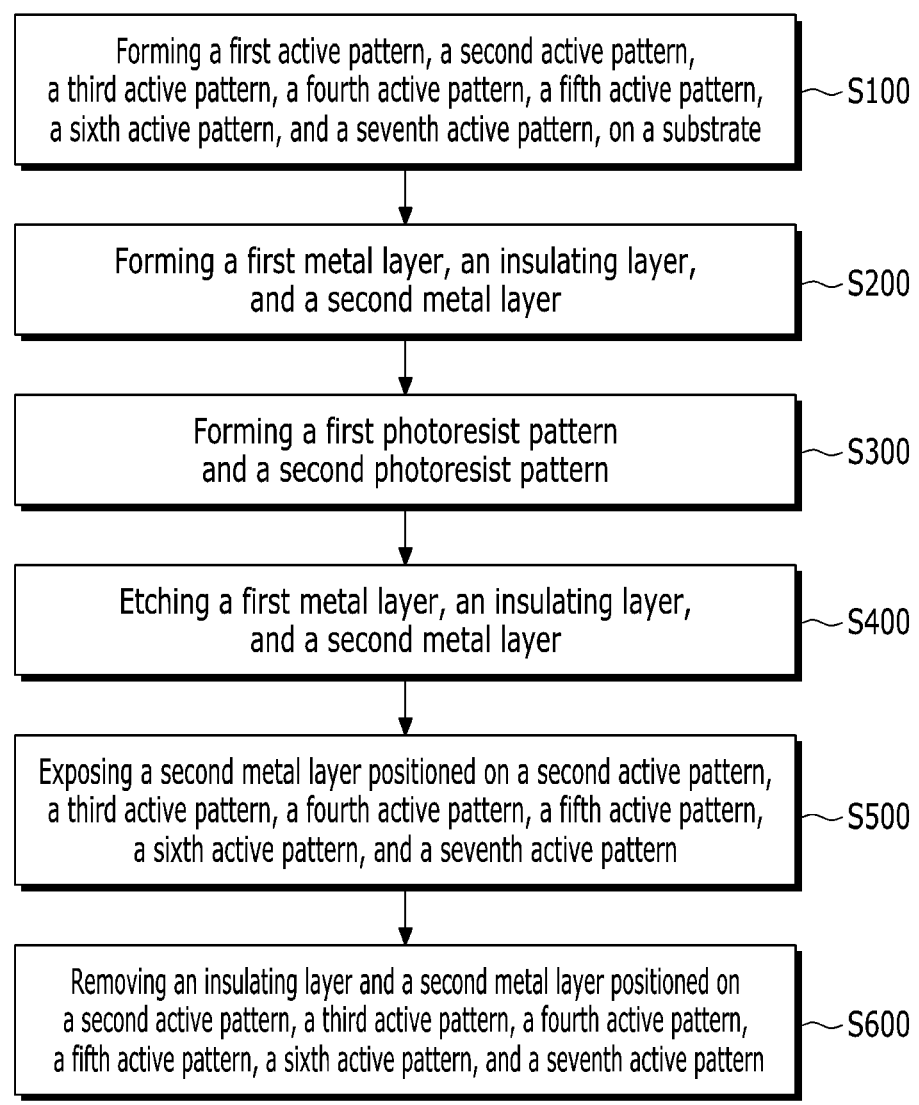
FIG. 4 is a flowchart showing a manufacturing method of an organic light emitting device according to another embodiment.

FIG. 4 is a flowchart showing a manufacturing method of an organic light emitting device according to an embodiment. FIG. 5 to FIG. 10 are views to explain the embodiment of a manufacturing method of an organic light emitting device. FIG. 6 is a cross-sectional view taken along a line VI-VI of FIG. 5.

Figure 5:
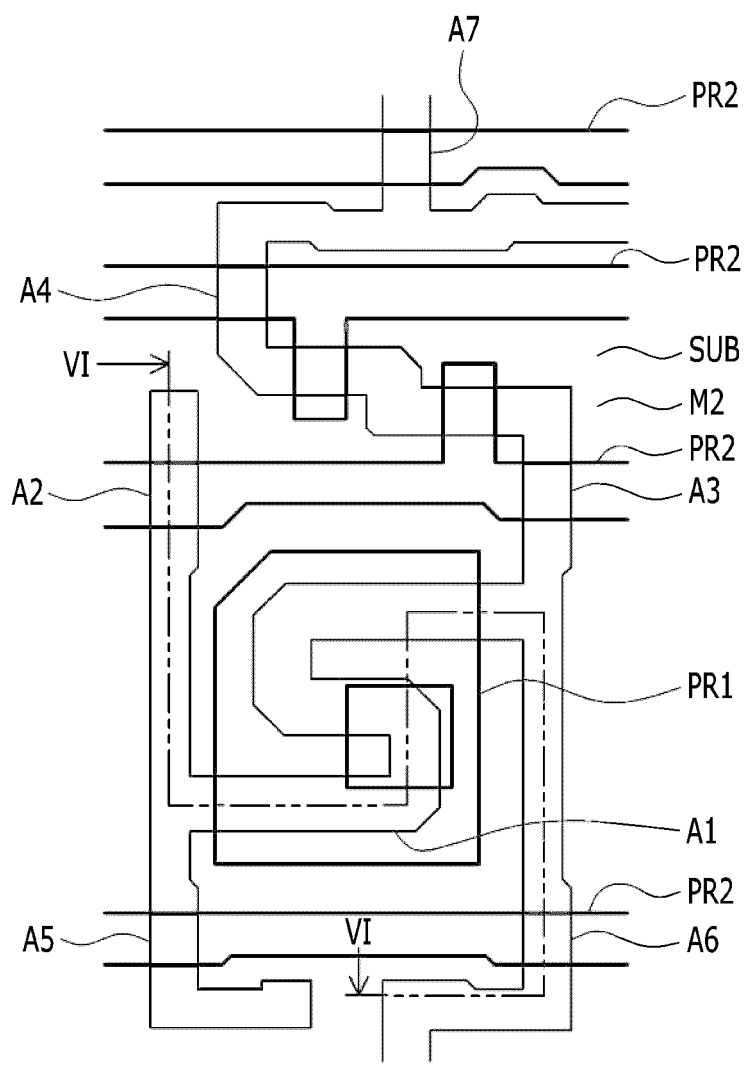
FIG. 5 to FIG. 10 are views to explain a manufacturing method of an organic light emitting device according to another embodiment.
Figure 6:
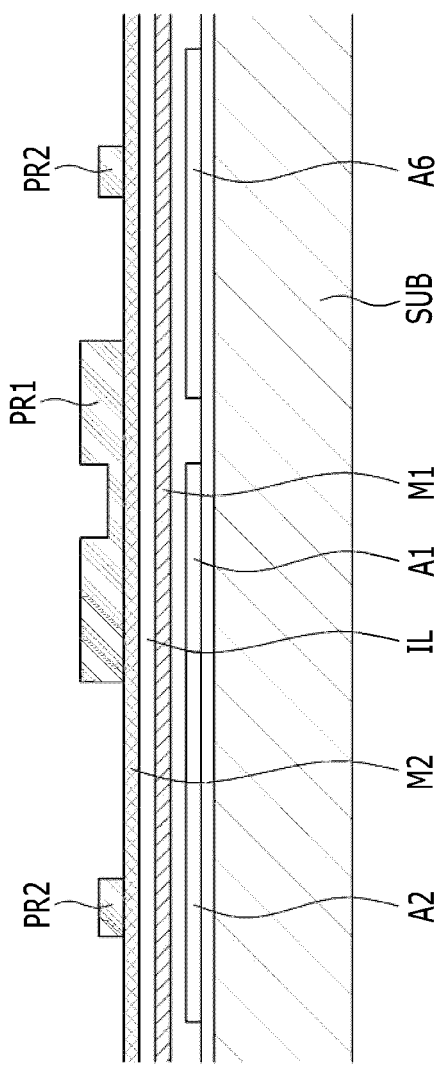

First, as shown in FIG. 4 to FIG. 6, a first active pattern A1, a second active pattern A2, a third active pattern A3, a fourth active pattern A4, a fifth active pattern A5, a sixth active pattern A6, and a seventh active pattern A7 are formed on the substrate SUB (S100).

A semiconductor layer including, for example, polysilicon or the oxide semiconductor is formed on the substrate SUB and etched by using a photolithography process to form the first active pattern A1, the second active pattern A2, the third active pattern A3, the fourth active pattern A4, the fifth active pattern A5, the sixth active pattern A6, and the seventh active pattern A7 that are integrally formed from the semiconductor layer.

Next, a first metal layer M1, an insulating layer IL, and a second metal layer M2 are sequentially formed on the first active pattern A1, the second active pattern A2, the third active pattern A3, the fourth active pattern A4, the fifth active pattern A5, the sixth active pattern A6, and the seventh active pattern A7 (S200).

The first metal layer M1, the insulating layer IL, and the second metal layer M2 are sequentially formed by using a deposition process such as, for example, a sputtering process, on the first active pattern A1, the second active pattern A2, the third active pattern A3, the fourth active pattern A4, the fifth active pattern A5, the sixth active pattern A6, and the seventh active pattern A7.

Next, a first photoresist pattern PR1 and a second photoresist pattern PR2 are formed on the second metal layer M2 (S300).

A photoresist layer is coated on the second metal layer M2 and exposed and developed by using a mask such as a halftone mask or a slit mask to form the first photoresist pattern PR1 having a first thickness on the second metal layer M2 corresponding to the first active pattern A1 and the second photoresist pattern PR2 having a second thickness thinner than the first thickness on the second metal layer M2 respectively corresponding to the second active pattern A2, the third active pattern A3, the fourth active pattern A4, the fifth active pattern A5, the sixth active pattern A6, and the seventh active pattern A7. In this case, the first photoresist pattern PR1 is formed for the portion corresponding to the opening of the above-described capacitor electrode that is formed later to have the second thickness. Also, the first photoresist pattern PR1 is formed of a shape corresponding to the first gate electrode that is formed later in a plane shape, and the second photoresist pattern PR2 is formed of a shape corresponding to the emission control line, the third scan line, the second scan line, the first scan line, the second gate electrode, the third gate electrode, the fourth gate electrode, the fifth gate electrode, the sixth gate electrode, and the seventh gate electrode in a plane shape.

Figure 7:
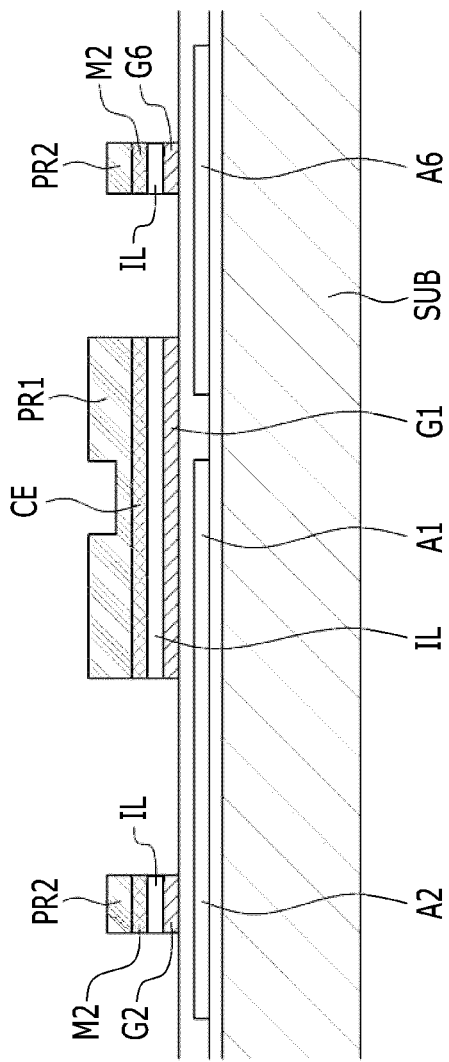

Next, as shown in FIG. 7, the first metal layer M1, the insulating layer IL, and the second metal layer M2 are etched (S400 in FIG. 4).

The first metal layer M1, the insulating layer IL, and the second metal layer M2 are etched through a dry etching using the first photoresist pattern PR1 and the second photoresist pattern PR2 as a mask. Accordingly, from each of the first metal layer M1 and the second metal layer M2, the first gate electrode G1 and the capacitor electrode CE having the same edge in a plane view are respectively formed on the first active pattern A1 positioned under the first photoresist pattern PR1, from the first metal layer M1, the second gate electrode G2, the third gate electrode G3, the fourth gate electrode G4, the fifth gate electrode G5, the sixth gate electrode G6, and the seventh gate electrode G7 that are respectively formed on the second active pattern A2, the third active pattern A3, the fourth active pattern A4, the fifth active pattern A5, the sixth active pattern A6, and the seventh active pattern A7 positioned under the second photoresist pattern PR2, and simultaneously a first scan line Sn, a second scan line Sn-1, a third scan line Sn-2, and an emission control line EM are formed.

Figure 8:
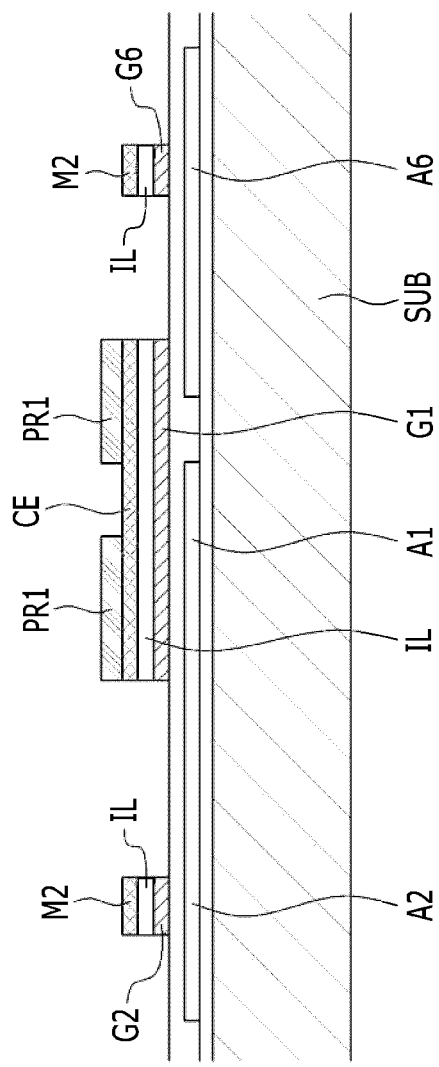

As shown in FIG. 8, the second metal layer M2 positioned on the second active pattern A2, the third active pattern A3, the fourth active pattern A4, the fifth active pattern A5, the sixth active pattern A6, and the seventh active pattern A7 is exposed (S500).

An ashing process is performed throughout the entire substrate SUB to remove the second photoresist pattern PR2. In this case, while the second photoresist pattern PR2 having the second thickness is removed, the first photoresist pattern PR1 having the first thickness is reduced in thickness and partially remains on the capacitor electrode CE. In this case, for the first photoresist pattern PR1, the portion corresponding to the opening of the above-described capacitor electrode CE (that is described below) is removed.

Figure 9:
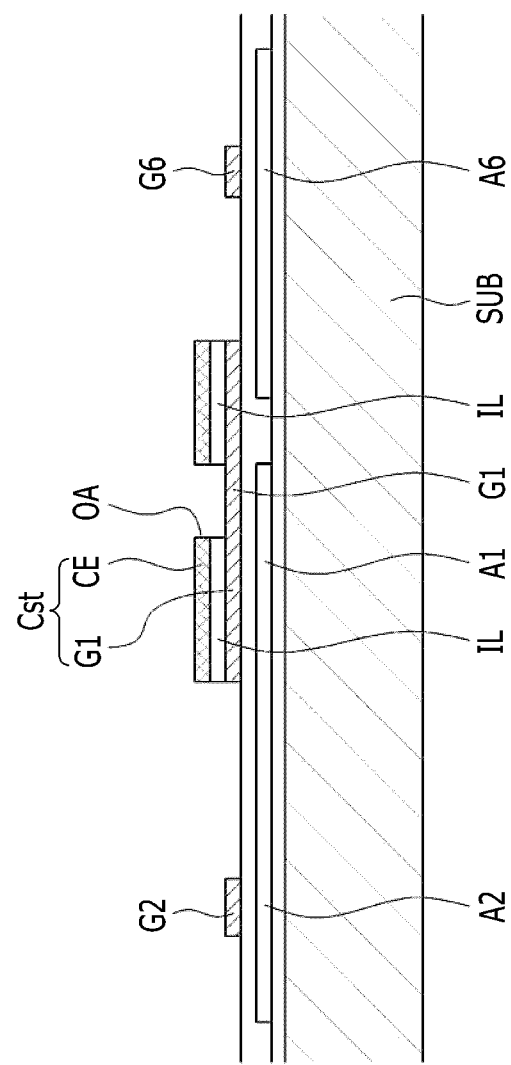

Next, as shown in FIG. 9, the insulating layer IL and the second metal layer M2 positioned on the second active pattern A2, the third active pattern A3, the fourth active pattern A4, the fifth active pattern A5, the sixth active pattern A6, and the seventh active pattern A7 is removed (S600).

The insulating layer IL and the second metal layer M2 positioned on the second active pattern A2, the third active pattern A3, the fourth active pattern A4, the fifth active pattern A5, the sixth active pattern A6, and the seventh active pattern A7 is removed and the opening OA is simultaneously formed in the capacitor electrode CE by using the dry etching or the wet etching using the first photoresist pattern PR1 as a mask.

Figure 10:
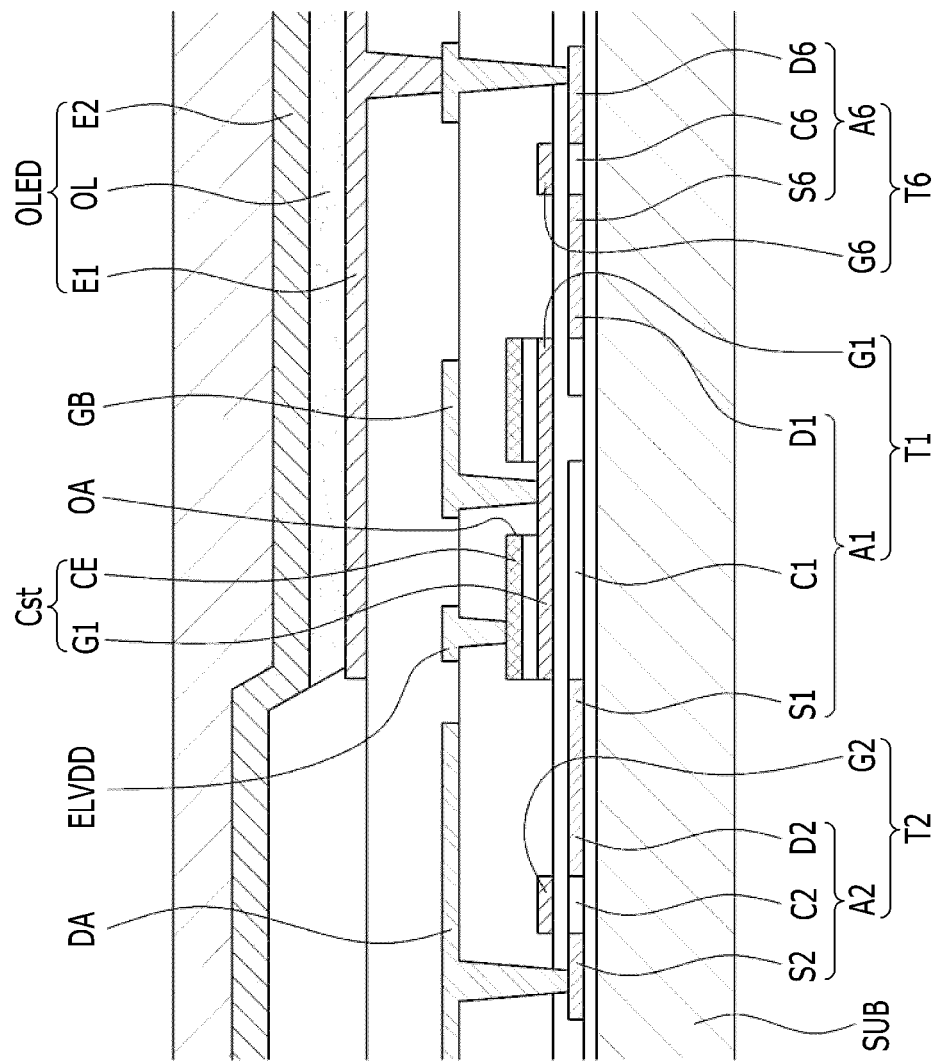

Next, as shown in FIG. 10, the first photoresist pattern PR1 is removed, and the impurity is respectively doped to the source electrode and the drain electrode of the active pattern by using the gate electrode as a mask, and a data line DA, a driving power source line ELVDD, a gate bridge GB, an initialization power source line Vin, an organic light emitting element OLED, and a thin film encapsulation layer are sequentially formed to manufacture the organic light emitting device.

As described above, in the manufacturing method of the organic light emitting device according to an embodiment, since the first gate electrode G1 forming the capacitor Cst and the capacitor Cst are simultaneously formed by using one etching process using the first photoresist pattern PR1 and the second photoresist pattern PR2 having the different thicknesses formed by the halftone mask as the mask, the number of masks used for manufacturing the organic light emitting device is reduced. By reducing the number of masks used for the manufacturing, a manufacturing method of the organic light emitting device that reduces the manufacturing time and the manufacturing cost is provided.

While this invention has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:
1. An organic light emitting device comprising:
a substrate;
a first thin film transistor including a first active pattern positioned on the substrate and a first gate electrode positioned on the first active pattern;
an organic light emitting element connected to the first active pattern;
a capacitor electrode overlapping the first gate electrode of the first thin film transistor, and having a same edge as the first gate electrode;
a second thin film transistor including a second active pattern connected to the first active pattern and a second gate electrode positioned on the second active pattern;
a third thin film transistor including a third active pattern connecting between the first active pattern and the first gate electrode and a third gate electrode positioned on the third active pattern;
a first scan line positioned on the second active pattern to respectively cross the second active pattern and the third active pattern and connected to the second gate electrode and the third gate electrode;
a data line positioned on the first scan line to cross the first scan line and connected to the second active pattern; and
a driving power source line positioned on the first scan line to be separated from the data line and to cross the first scan line and connected to the capacitor electrode and the first active pattern.

2. The organic light emitting device of claim 1, wherein the first gate electrode of the first thin film transistor and the capacitor electrode have the same edge in a plane view.

3. The organic light emitting device of claim 1, comprising a capacitor formed by the first gate electrode of the first thin film transistor and the capacitor electrode.

4. The organic light emitting device of claim 1, wherein the first gate electrode of the first thin film transistor and the capacitor electrode each include a metal.

5. The organic light emitting device of claim 1, wherein the capacitor electrode has an island shape.

6. The organic light emitting device of claim 1, wherein a channel region of the first active pattern overlapping the first gate electrode of the first thin film transistor has a shape that is bent and extends at least once.

7. The organic light emitting device of claim 1, further comprising
a gate bridge positioned on the first scan line to be separated from the driving power source line and connecting the third active pattern and the first gate electrode.

8. The organic light emitting device of claim 7, wherein the capacitor electrode includes an opening exposing a portion of the first gate electrode, and the gate bridge is connected to the first gate electrode through the opening.

9. The organic light emitting device of claim 7, wherein the first active pattern, the second active pattern, and the third active pattern are respectively positioned with the same layer, and
the data line, the driving power source line, and the gate bridge are respectively positioned with the same layer.

10. The organic light emitting device of claim 1, further comprising:
a fourth thin film transistor including a fourth active pattern connected to the first gate electrode and the third active pattern and a fourth gate electrode positioned on the fourth active pattern;
a second scan line positioned on the fourth active pattern to cross the fourth active pattern and connected to the fourth gate electrode; and
an initialization power source line positioned on the second scan line and connected to the fourth active pattern.

11. The organic light emitting device of claim 10, wherein the first gate electrode, the second gate electrode, the third gate electrode, the fourth gate electrode, the first scan line, and the second scan line are respectively positioned with the same layer.

12. The organic light emitting device of claim 10, further comprising:
a seventh thin film transistor including a seventh active pattern connected to the fourth active pattern and a seventh gate electrode positioned on the seventh active pattern; and
a third scan line positioned on the seventh active pattern to cross the seventh active pattern and connected to the seventh gate electrode.

13. The organic light emitting device of claim 1, further comprising:

a fifth thin film transistor including a fifth active pattern connecting between the first active pattern and the driving power source line and a fifth gate electrode positioned on the fifth active pattern;

a sixth thin film transistor including a sixth active pattern connecting between the first active pattern and the organic light emitting element and a sixth gate electrode positioned on the sixth active pattern; and an emission control line positioned on the fifth active pattern and the sixth active pattern to respectively cross the fifth active pattern and the sixth active pattern and respectively connected to the fifth gate electrode and the sixth gate electrode.

14. The organic light emitting device of claim 13, wherein the first gate electrode, the second gate electrode, the third gate electrode, the fifth gate electrode, the sixth gate electrode, and the emission control line are respectively positioned with the same layer.

* * * * *